United States Patent
Wan

(10) Patent No.: US 9,484,305 B2
(45) Date of Patent: Nov. 1, 2016

(54) OFFSET CONTACTS FOR REDUCED OFF CAPACITANCE IN TRANSISTOR SWITCHES

(71) Applicant: SKYWORKS SOLUTIONS, INC., Worburn, CA (US)

(72) Inventor: Bin Wan, Tewksbury, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/803,588

(22) Filed: Jul. 20, 2015

(65) Prior Publication Data
US 2016/0020173 A1 Jan. 21, 2016

Related U.S. Application Data

(60) Provisional application No. 62/026,835, filed on Jul. 21, 2014.

(51) Int. Cl.
| | |
|---|---|
| *H01L 23/535* | (2006.01) |
| *H01L 27/088* | (2006.01) |
| *H01L 27/02* | (2006.01) |
| *H01L 21/8234* | (2006.01) |

(52) U.S. Cl.
CPC ......... *H01L 23/535* (2013.01); *H01L 27/0207* (2013.01); *H01L 27/088* (2013.01); *H01L 21/823475* (2013.01); *H01L 2224/05554* (2013.01); *H01L 2224/48091* (2013.01); *H01L 2224/48227* (2013.01); *H01L 2224/49171* (2013.01); *H01L 2924/15184* (2013.01); *H01L 2924/15192* (2013.01); *H01L 2924/181* (2013.01)

(58) Field of Classification Search
CPC .................. H01L 23/535; H01L 21/823475; H01L 27/088
USPC ........................................... 438/297; 257/401
See application file for complete search history.

(56) References Cited

U.S. PATENT DOCUMENTS

| | | | |
|---|---|---|---|
| 2012/0086497 A1* | 4/2012 | Vorhaus | H01L 27/0207 327/427 |
| 2013/0115895 A1* | 5/2013 | Crandall | H01L 27/1211 455/73 |

* cited by examiner

*Primary Examiner* — Yasser A Abdelaziez
(74) *Attorney, Agent, or Firm* — Chang & Hale LLP

(57) ABSTRACT

Systems, apparatuses and methods for reduced OFF capacitance in switching devices are disclosed. A semiconductor die may include a semiconductor substrate, first and second elongated doped regions, said first region serving as a source of a first transistor, said second region serving as a drain of the first transistor and a source of a second transistor. The semiconductor die further includes a plurality of elongated gate structures including a first gate structure disposed between the first and second regions and serving as a gate of the first transistor. The semiconductor die further includes a first set of evenly-spaced electrical contact pads disposed on the first region, and a second set of evenly-spaced electrical contact pads disposed on the second region, the second set of contact pads being offset with respect to the first set of contact pads in a longitudinal direction of the first and second regions.

20 Claims, 9 Drawing Sheets

OFFSET CONTACTS FOR REDUCED OFF CAPACITANCE IN TRANSISTOR SWITCHES

RELATED APPLICATION

This application claims priority to U.S. Provisional Application No. 62/026,835, filed on Jul. 21, 2014, entitled OFFSET CONTACTS FOR REDUCED OFF CAPACITANCE IN TRANSISTOR SWITCHES, the disclosure of which is hereby incorporated by reference in its entirety.

BACKGROUND

1. Field

The present disclosure generally relates to the field of electronics, and more particularly, to radio-frequency (RF) devices.

2. Description of Related Art

In RF devices, RF switching devices can be used to route electrical signals. OFF capacitance in RF switching devices can adversely affect performance such devices.

SUMMARY

In some implementations, the present disclosure relates to a semiconductor die including a semiconductor substrate and first and second elongated doped regions, said first region serving as a source of a first transistor, said second region serving as a drain of the first transistor and a source of a second transistor. The semiconductor die further includes a plurality of elongated gate structures including a first gate structure disposed between the first and second regions and serving as a gate of the first transistor, a first set of evenly-spaced electrical contact pads disposed on the first region, and a second set of evenly-spaced electrical contact pads disposed on the second region, the second set of contact pads being offset with respect to the first set of contact pads in a longitudinal direction of the first and second regions.

The offset position of the second set of contact pads may provide reduced OFF-state capacitance for a switch device of the semiconductor die compared to a non-offset position of the second set of contact pads. The semiconductor die may further include a buried oxide layer disposed substantially between the semiconductor substrate and the first and second regions.

In certain embodiments, each of the first and second sets of contact pads has a substantially square surface area with sides of a length L. Evenly-spaced electrical contact pads of the first and second sets may be spaced from one another by a distance D, the distance D being at least two times the length L. The first and second sets of contact pads may be disposed within 0.7 μm of one another in a lateral direction. In certain embodiments, the semiconductor die further includes a plurality of MOSFET transistors connected in series, the plurality of gate structures providing respective gates for the plurality of transistors. The plurality of transistors may include the first and second transistors.

In some implementations, the present disclosure relates to a process of fabricating a semiconductor die. The process may involve providing a semiconductor substrate and forming first and second elongated doped regions, said first region serving as a source of a first transistor, said second region serving as a drain of the first transistor and a source of a second transistor. The process may further involve forming a plurality of elongated gate structures including a first gate structure disposed between the first and second regions and serving as a gate of the first transistor, disposing a first set of evenly-spaced electrical contact pads on the first region, and disposing a second set of evenly-spaced electrical contact pads on the second region, the second set of contact pads being offset with respect to the first set of contact pads in a longitudinal direction of the first and second regions. The offset position of the second set of contact pads may provide reduced OFF-state capacitance for a switch device of the semiconductor die compared to a non-offset position of the second set of contact pads.

In certain embodiments, the process further involves forming a buried oxide layer substantially between the semiconductor substrate and the first and second regions. Each of the first and second sets of contact pads may have a substantially square surface area with sides of a length L. In certain embodiments, evenly-spaced electrical contact pads of the first and second sets are spaced from one another by a distance D, the distance D being at least two times the length L. The first and second sets of contact pads may be disposed within 0.7 μm of one another in a lateral direction. The plurality of gate structures may provide respective gates for a plurality of MOSFET transistors connected in series. In certain embodiments, the plurality of transistors includes the first and second transistors.

In some implementations, the present disclosure relates to a radio-frequency (RF) module including a packaging substrate configured to receive a plurality of components and a die mounted on the packaging substrate, the die having a semiconductor substrate, first and second elongated doped regions, said first region serving as a source of a first transistor, said second region serving as a drain of the first transistor and a source of a second transistor, a plurality of elongated gate structures including a first gate structure disposed between the first and second regions and serving as a gate of the first transistor, a first set of evenly-spaced electrical contact pads disposed along a longitudinal direction on the first region, and a second set of evenly-spaced electrical contact pads disposed along the longitudinal direction on the second region, the second set of contact pads being offset with respect to the first set of contact pads in the longitudinal direction. The RF module further includes a plurality of connectors configured to provide electrical connections between the die and the packaging substrate.

In certain embodiments, each of the first and second sets of contact pads has a substantially square surface area with sides of a length L. Evenly-spaced electrical contact pads of the first and second sets may be spaced from one another by a distance D, the distance D being at least two times the length L. In certain embodiments, the first and second sets of contact pads are disposed within 0.7 μm of one another in a lateral direction.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Figure 1:
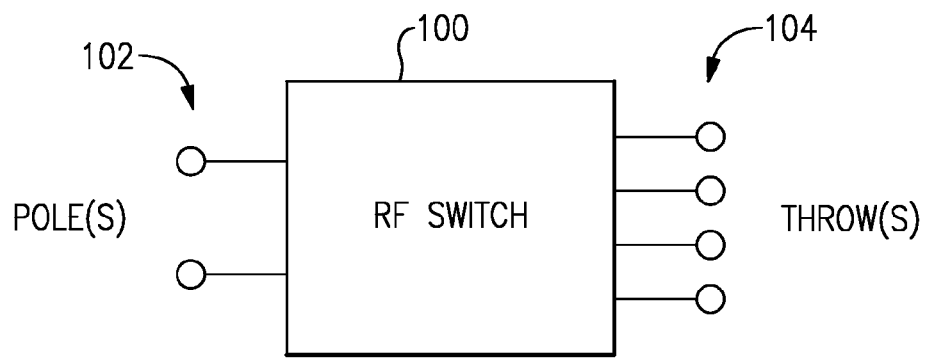
FIG. 1 schematically shows a radio-frequency (RF) switch configured to switch one or more signals between one or more poles and one or more throws according to one or more embodiments.

FIG. 1 schematically shows a radio-frequency (RF) switch 100 configured to switch one or more signals between one or more poles 102 and one or more throws 104. In some embodiments, such a switch can be based on one or more field-effect transistors (FETs) such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state.

Figure 2:
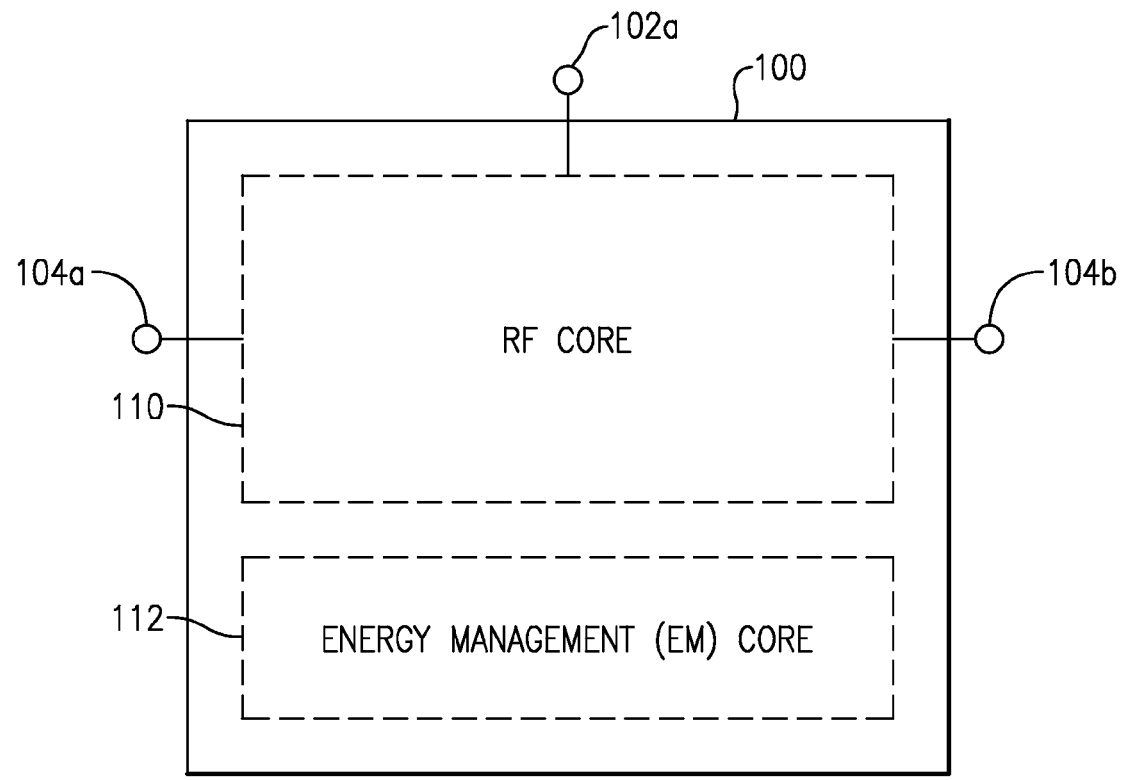
FIG. 2 shows an RF switch including an RF core and an energy management (EM) core according to one or more embodiments.

FIG. 2 shows that in some implementations, the RF switch 100 of FIG. 1 can include an RF core 110 and an energy management (EM) core 112. The RF core 110 can be configured to route RF signals between the first and second ports. In the example single-pole-double-throw (SPDT) configuration shown in FIG. 2, such first and second ports can include a pole 102a and a first throw 104a, or the pole 102a and a second throw 104b.

In some embodiments, EM core 112 can be configured to supply, for example, voltage control signals to the RF core. The EM core 112 can be further configured to provide the RF switch 100 with logic decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration as shown in FIG. 2.

Figure 3:
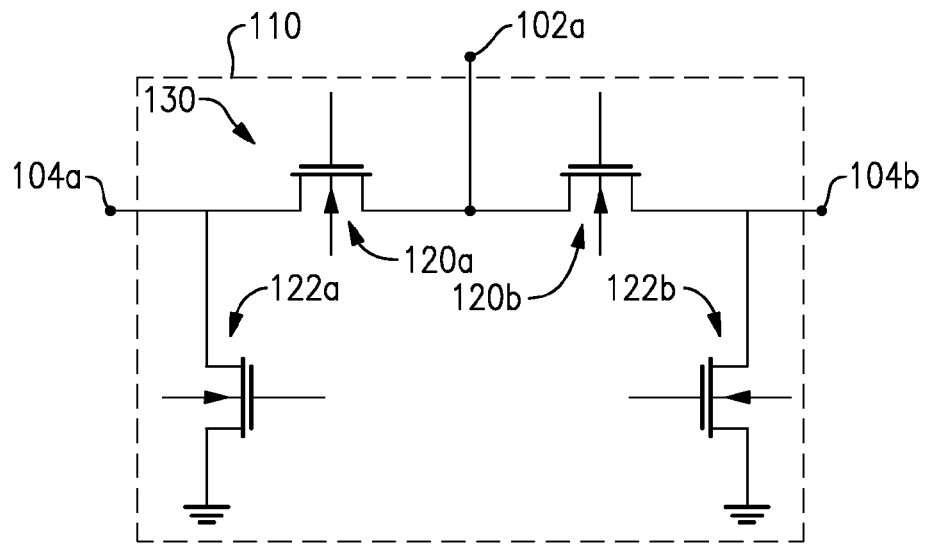
FIG. 3 shows an example of the RF core implemented in a single-pole-double-throw (SPDT) configuration according to one or more embodiments.

In the example SPDT context, FIG. 3 shows a more detailed example configuration of an RF core 110. The RF core 110 is shown to include a single pole 102a coupled to first and second throw nodes 104a, 104b via first and second transistors (e.g., FETs) 120a, 120b. The first throw node 104a is shown to be coupled to an RF ground via a FET 122a to provide shunting capability for the node 104a. Similarly, the second throw node 104b is shown to be coupled to the RF ground via an FET 122b to provide shunting capability for the node 104b.

In an example operation, when the RF core 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. The shunt FET 122b associated with the second throw node 104b can be in an ON state so that any RF signals or noise arriving at the RF core 110 through the second throw node 104b is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one poles, and the number of throws can be less than or greater than the example number of two.

In the example of FIG. 3, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs.

OFF state isolation is a switching device performance parameter that provides a measure of the RF isolation between an input port and an output port an RF switching device. In some embodiments, it can be a measure of the RF isolation of a switching device while the switching device is in a state where an input port and an output port are electrically isolated, for example while the switching device is in an OFF state. Increased switching device isolation can improve RF signal integrity. In certain embodiments, an increase in isolation can improve wireless communication device performance.

Isolation can be negatively affected by parasitic capacitances in transistor devices. For example, when the transistor 120a or 120b is in an OFF state, wherein drain-to-source current in the transistor is substantially inhibited, parasitic capacitances may exist between one or more terminals of the transistor, which can negatively impact performance of the RF core 110. For example, OFF-state capacitance (also referred to herein as "OFF capacitance, or $C_{off}$), together with the resistances in the circuit, may at least partially limit the speed of the transistor. Various parasitic capacitances of the transistors 120a, 120b may be created at least in part by the depletion regions between source/drain and bulk substrate of the transistors.

In order to reduce the effects of OFF-state transistor capacitances, certain RF core embodiments comprise one or more transistors having increased source/drain spacing, which may serve to provide a reduction in OFF capacitance. However, such increase in spacing may result in larger device area, and may therefore be undesirable or impractical in certain devices/circuits. Certain embodiments disclosed herein provide for reduced $C_{off}$ in a switching circuit, wherein source/drain contacts are offset, thereby increasing the distance between such contacts to promote reduction in the capacitance. Advantageously, offset source/drain contacts may be implemented without producing adverse effects for certain large-device-width embodiments. Furthermore, the overall number of contacts may be reduced by increasing their spacing. However, such increase in spacing may increase the ON-state resistance ($R_{on}$) of the switch, and may therefore be undesirable in certain circuit configurations.

Figure 4:
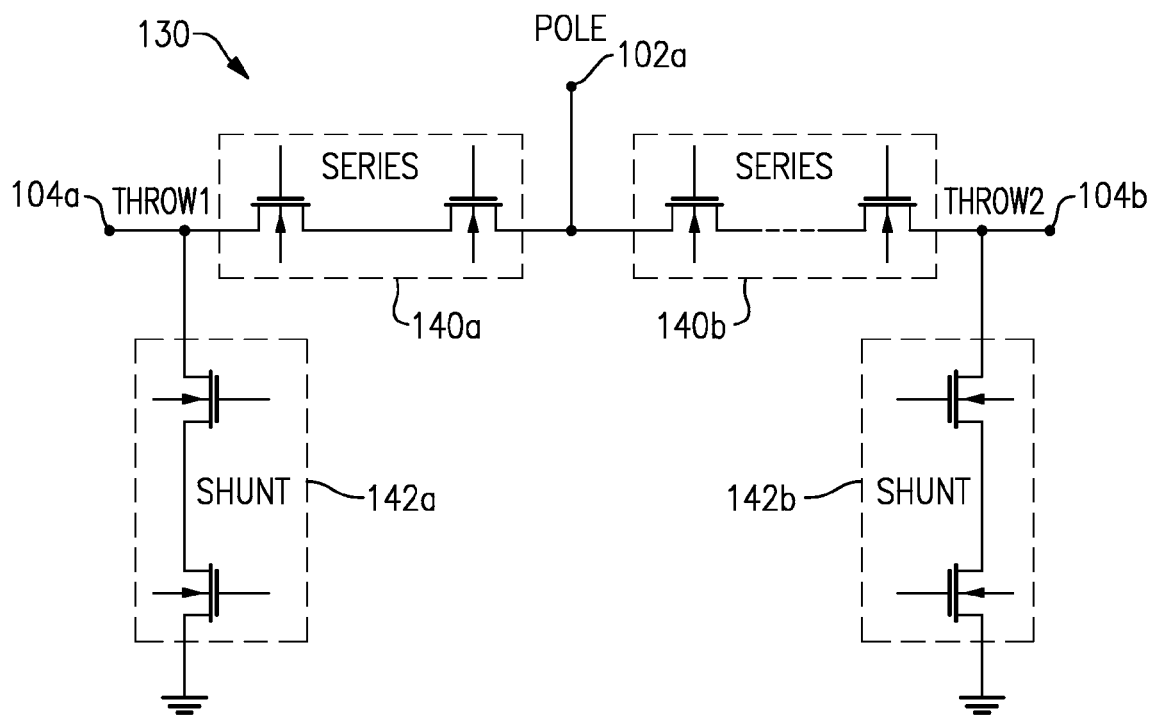
FIG. 4 shows an example of an RF core implemented in an SPDT configuration where each switch arm includes a plurality of field-effect transistors (FETs) connected in series according to one or more embodiments.

An example RF core configuration 130 of an RF core having switch arm segments is shown in FIG. 4. In the example, the pole 102a and the first throw node 104a are shown to be coupled via a first switch arm segment 140a. Similarly, the pole 102a and the second throw node 104b are shown to be coupled via a second switch arm segment 140b. The first throw node 104a is shown to be capable of being shunted to an RF ground via a first shunt arm segment 142a. Similarly, the second throw node 104b is shown to be capable of being shunted to the RF ground via a second shunt arm segment 142b.

In an example operation, when the RF core 130 is in a state where an RF signal is being passed between the pole 102a and the first throw node 104a, all of the FETs in the first switch arm segment 140a can be in an ON state, and all of the FETs in the second switch arm segment 104b can be in an OFF state. The first shunt arm 142a for the first throw node 104a can have all of its FETs in an OFF state so that the RF signal is not shunted to ground as it travels from the pole 102a to the first throw node 104a. All of the FETs in the second shunt arm 142b associated with the second throw node 104b can be in an ON state so that any RF signals or noise arriving at the RF core 130 through the second throw node 104b is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 140a, 140b, 142a, 142b) can include one or more semiconductor transistors such as FETs. In some embodiments, an FET may be capable of being in a first state or a second state and can include a gate, a drain, a source, and a body (sometimes also referred to as a substrate. In some embodiments, an FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state). As discussed herein, OFF capacitance of one or more of the FETs of the arm segments can affect switch isolation performance.

Examples of FET Structures and Fabrication Process Technologies:

A switching device can be implemented on-die, off-die, or some combination thereon. A switching device can also be fabricated using various technologies. In some embodiments, RF switching devices can be fabricated with silicon or silicon-on-insulator (SOI) technology.

As described herein, an RF switching device can be implemented using silicon-on-insulator (SOI) technology. In some embodiments, SOI technology can include a semiconductor substrate having an embedded layer of electrically insulating material, such as a buried oxide layer beneath a silicon device layer. For example, an SOI substrate can include an oxide layer embedded below a silicon layer. Other insulating materials known in the art can also be used.

Implementation of RF applications, such as an RF switching device, using SOI technology can improve switching device performance. In some embodiments, SOI technology can enable reduced power consumption. Reduced power consumption can be desirable in RF applications, including those associated with wireless communication devices. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate-related RF losses. Electrically isolated SOI transistors can facilitate stacking, contributing to decreased chip size.

Figure 5A:
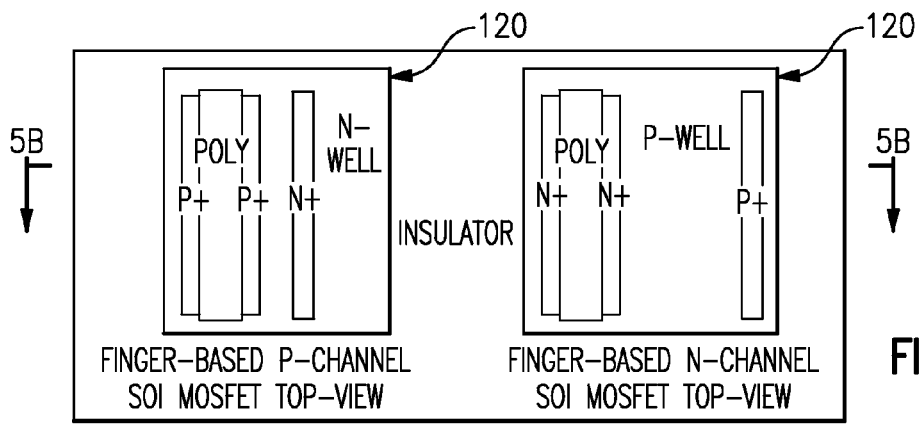
FIGS. 5A and 5B show plan and side sectional views, respectively, of an example finger-based FET device implemented on silicon-on-insulator (SOI) according to one or more embodiments.
Figure 5B:
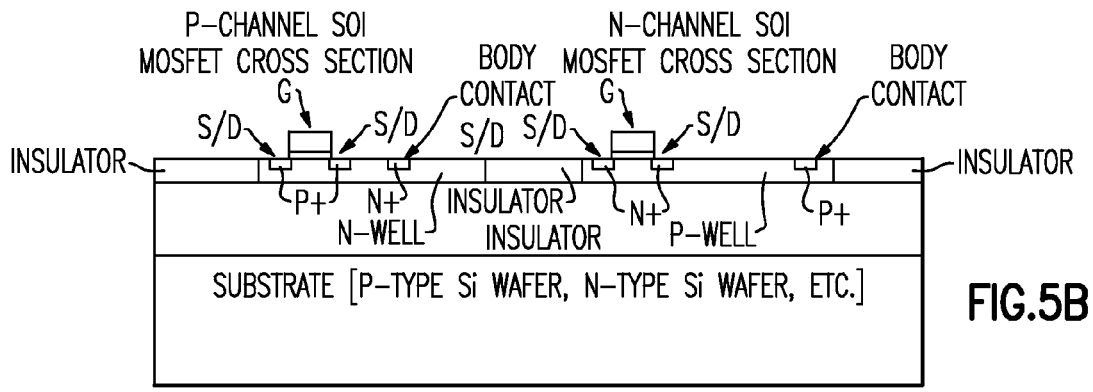

In some SOI FET configurations, each transistor can be configured as a finger-based device where the source and drain are rectangular shaped (in a plan view) and a gate structure extends between the source and drain like a rectangular shaped finger. FIGS. 5A and 5B show plan and side sectional views of an example finger-based FET device implemented on SOI. As shown, FET devices described herein can include a p-type FET or an n-type FET. Thus, although some FET devices are described herein as p-type devices, it will be understood that various concepts associated with such p-type devices can also apply to n-type devices.

As shown in FIGS. 5A and 5B, a pMOSFET can include an insulator layer formed on a semiconductor substrate. The insulator layer can be formed from materials such as silicon dioxide or sapphire. An n-well is shown to be formed in the insulator such that the exposed surface generally defines a rectangular region. Source (S) and drain (D) are shown to be p-doped regions whose exposed surfaces generally define rectangles. As shown, S/D regions can be configured so that source and drain functionalities are reversed.

FIGS. 5A and 5B further show that a gate (G) can be formed on the n-well so as to be positioned between the source and the drain. The example gate is depicted as having a rectangular shape that extends along with the source and the drain. Also shown is an n-type body contact. Formations of the rectangular shaped well, source and drain regions, and the body contact can be achieved by a number of known techniques.

Figure 6A:
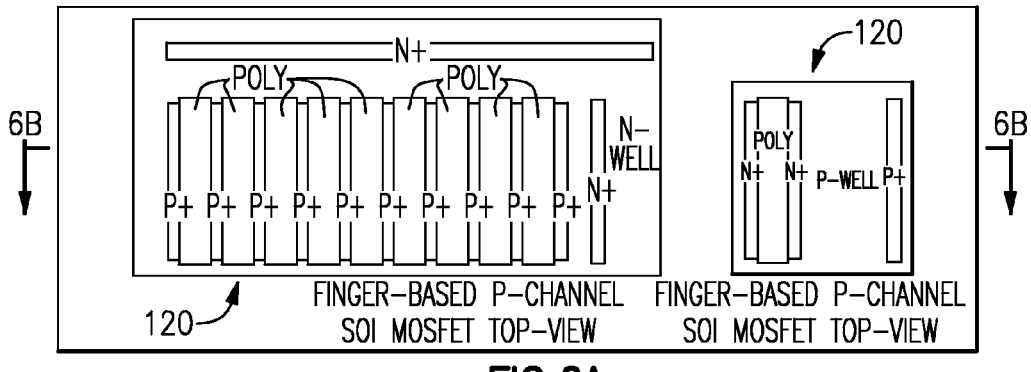
FIGS. 6A and 6B show plan and side sectional views, respectively, of an example multiple-finger FET device implemented on SOI according to one or more embodiments.
Figure 6B:
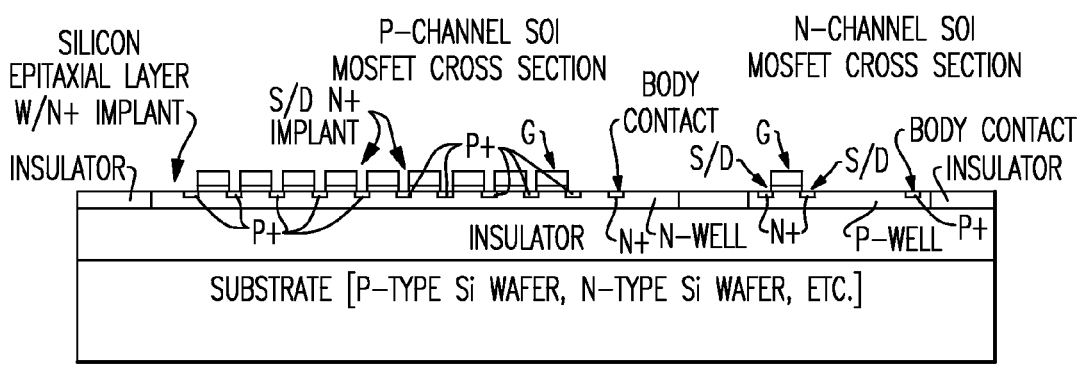

FIGS. 6A and 6B show plan and side sectional views of an example of a multiple-finger FET device implemented on SOI. Formations of rectangular shaped n-well, rectangular shaped p-doped regions, rectangular shaped gates, and n-type body contact can be achieved in manners similar to those described in reference to FIGS. 5A and 5B.

The example multiple-finger FET device of FIGS. 6A and 6B can be made to operate such that a drain of one FET acts as a source of its neighboring FET. Thus, the multiple-finger FET device as a whole can provide a voltage-dividing functionality. For example, an RF signal can be provided at one of the outermost p-doped regions (e.g., the leftmost p-doped region); and as the signal passes through the series of FETs, the signal's voltage can be divided among the FETs. In such an example, the rightmost p-doped region can act as an overall drain of the multi-finger FET device.

In some implementations, a plurality of the foregoing multi-finger FET devices can be connected in series as a switch to, for example, further facilitate the voltage-dividing functionality. A number of such multi-finger FET devices can be selected based on, for example, power handling requirement of the switch.

Figure 7:
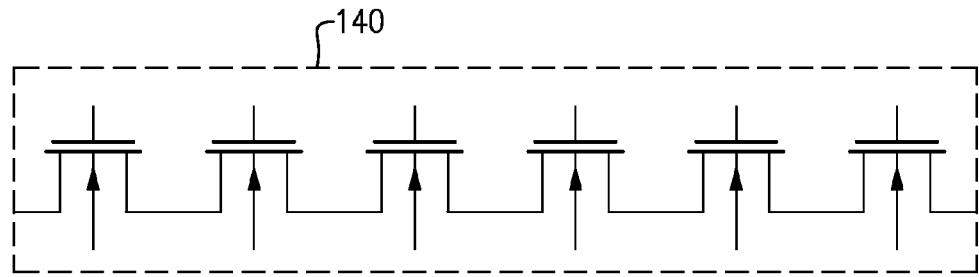
FIG. 7 illustrates a switch arm segment including a plurality of stacked transistor devices according to one or more embodiments.

FIG. 7 illustrates an embodiment of a switch arm segment 140 including a plurality of stacked transistor devices, such as FET devices, as described herein. In certain embodiments, the transistor stack of FIG. 7 may be constructed using SOI technology. The transistors may be connected in series, wherein the drain of one transistor is connected to the source of another series transistor, and/or vice versa. The stack of short-channel transistor devices in the switch arm segment 140 may be substantially equivalent to a long-channel transistor in certain configurations. That is, the effective channel length of the transistors 140 may correspond to a sum of the channel lengths of the individual series devices.

Figure 8:
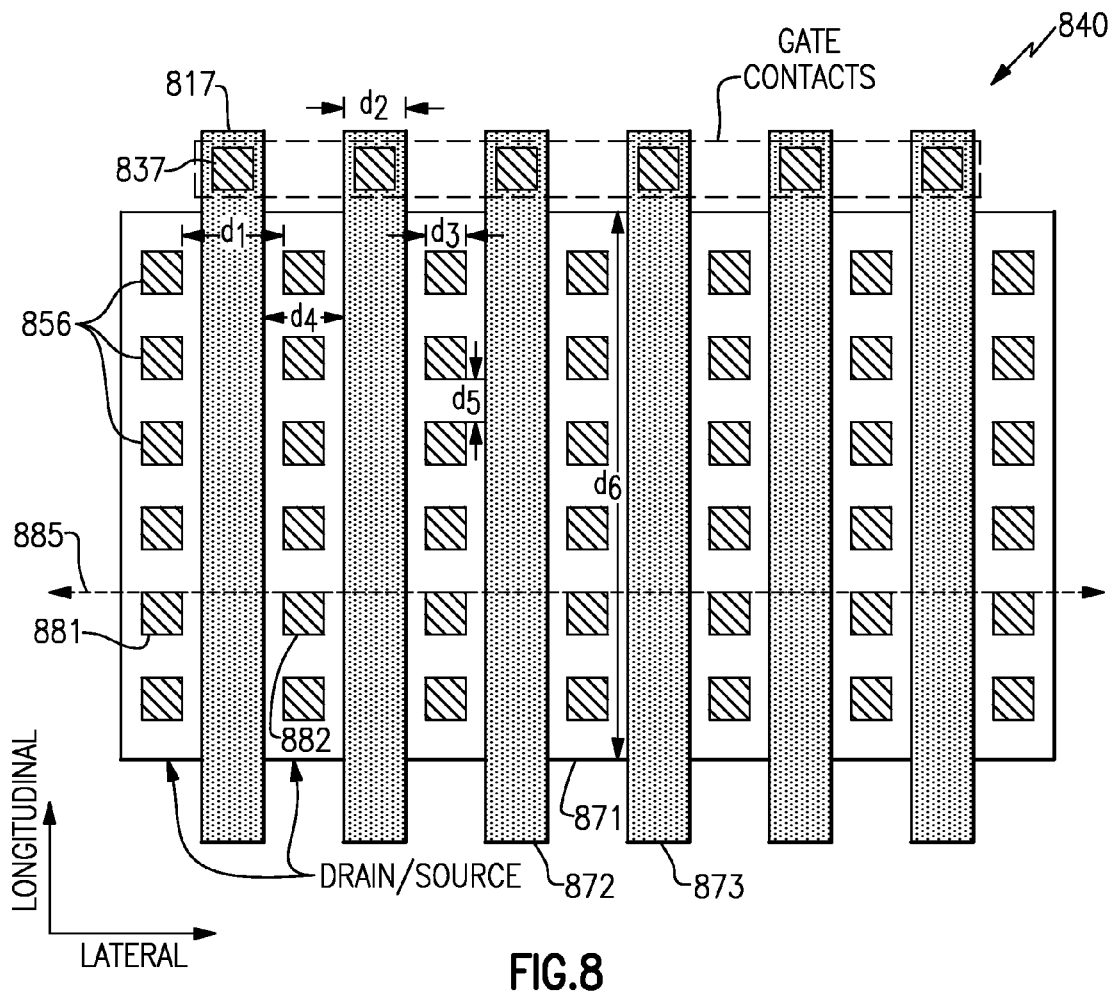
FIG. 8 illustrates a layout design associated with a switch arm segment according to one or more embodiments.

FIG. 8 illustrates a layout design associated with the switch arm segment 140 illustrated in FIG. 7. The device 840 includes a plurality of gate channel portions 817, which provide the gates for each of the six respective transistors. The gate channel portions 817 may comprise polysilicon, metal, or the like. Although the illustrated embodiments comprise six series transistors, it should be understood that the principles disclosed herein may be applicable to any number of series transistors and the illustrated configuration is provided for illustrative purposes only. The gate portions 817 may have disposed in electrical connection therewith one or more gate contact pads 837, or windows, for providing electrical contact with the respective gates. The contact pads 837 may comprise metal, for example.

The device 840 further includes doped drain and/or source portions disposed between and/or adjacent to the gate portions 817, as illustrated. For example, a doped semiconductor region 871 may serve as a drain region for a first transistor associated with a first gate 872, and as a source region for a second transistor associated with a second gate 873. The various drain/source regions may have disposed thereon one or more drain/source contact pads, or windows 856. That is, each drain/source region may have a set of contacts that are evenly-spaced in a longitudinal direction $d_6$ of the region. In certain embodiments, contact pads have a width or length $d_3$ of: approximately 0.16 μm or less; between 0.16 and 0.20 μm; between 0.20 and 0.22 μm; or greater than 0.22 μm. Such dimensions may depend at least in part on the particular foundry technology process utilized. The dimension $d_3$ may represent either the length or width of the contacts. In certain embodiments, the contacts are substantially square, such that the dimension $d_3$ is representative of both the length and the width of the contacts.

In certain embodiments, the drain/source contacts are disposed at a substantially-minimum spacing and directly aligned with each other in a lateral direction from source-to-drain. That is, the contact-to-contact distance $d_5$ may be a substantially minimum distance. For example, the distance $d_5$ may be: approximately 0.24 μm or less; between 0.24 and 0.26 μm; or approximately 0.26 μm or greater. In certain embodiments, the smaller the distance $d_5$, the greater the OFF-state capacitance of the device 840.

The contacts (e.g., 881, 882) may be substantially aligned in a direction 885 generally perpendicular to the length of the gate channels 817. In the direction 885, the contacts may be spaced apart by a distance $d_1$, wherein the greater the distance $d_1$, the less the capacitance of the device 840 in certain configurations or embodiments. The distance $d_1$ may depend at least in part on the gate length $d_2$, which separates adjacent source/drain regions, and/or the gate spacing (i.e., width of source/drain regions) $d_4$. In certain embodiments, the distance $d_1$ is approximately 0.56 μm or less, between 0.56 to 0.64 μm, or approximately 0.64 μm or greater.

Furthermore, the dimension $d_2$, which represents the channel, or gate, length (L), may be approximately 0.24 μm or less, between 0.24 and 0.28 μm, approximately 0.28 μm, between 0.28 and 0.32 μm, or approximately 0.32 μm or greater. The gate-to-gate spacing $d_4$ may be based at least in part on the contact width $d_3$. For example, the spacing $d_4$ may be approximately equal to: $d_3+2\times(0.16$ or $0.14$ μm$)$, or between approximately 0.44 and 0.54 μm. However, as described in greater detail below, the dimension $d_4$ may be substantially greater in certain embodiments, which may reduce the capacitance of the device 840. The width of the device 840 may be represented by the dimension $d_6$, —the width (W) of the device may be between approximately 10 to 40 μm for certain RF switch embodiments.

Figure 9:
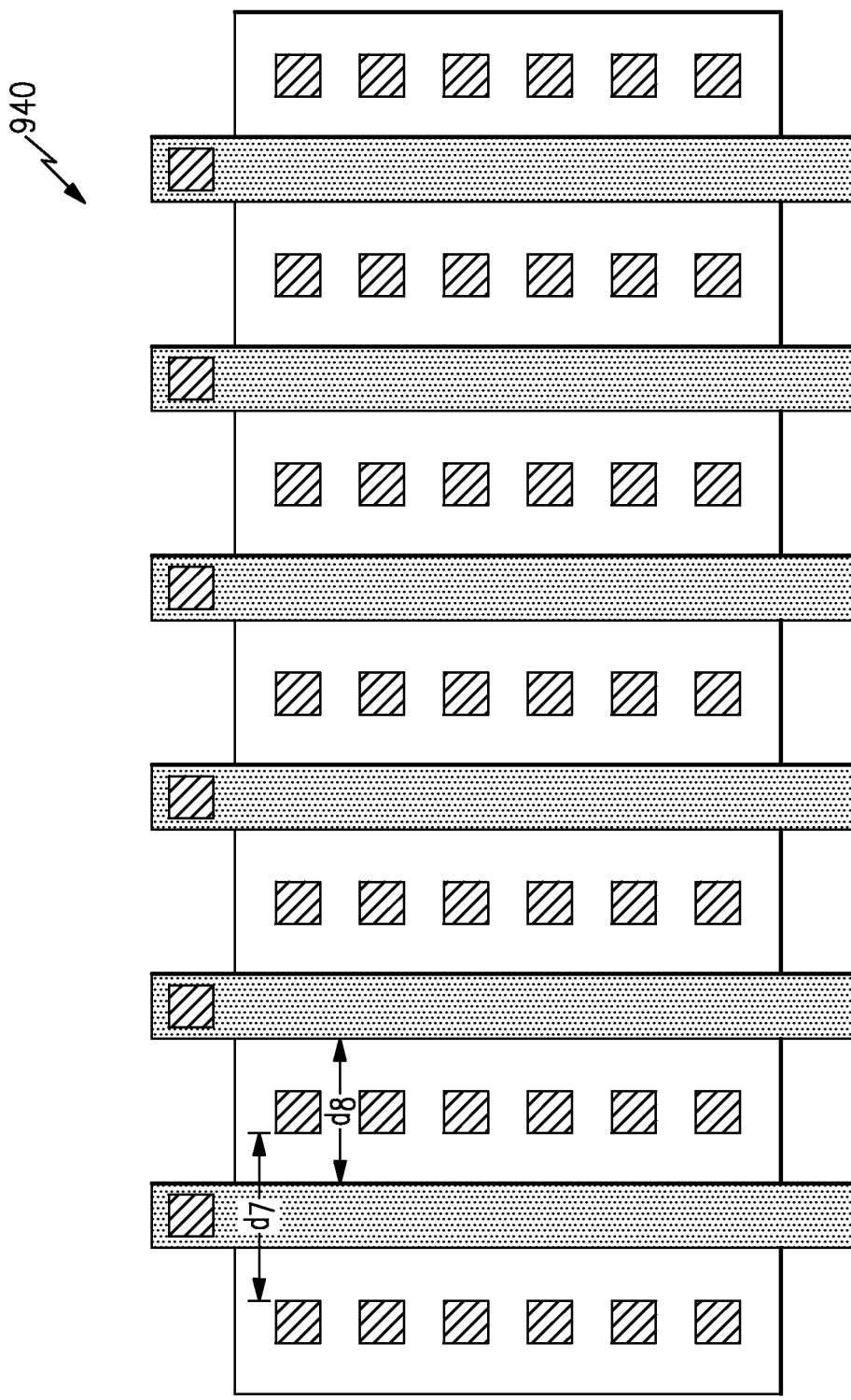
FIG. 9 illustrates a device having increased lateral contact-to-contact spacing according to one or more embodiments.

FIG. 9 illustrates a device 940 having increased lateral contact-to-contact spacing. As shown, the dimension $d_7$ may be enlarged with respect to the dimension $d_1$ shown in FIG. 8. For example, the distance $d_7$ may be approximately 0.8 μm, between 0.8 to 1.0 μm, or approximately 1.0 μm or greater. Furthermore, the gate-to-gate drain/source spacing $d_8$ may also be enlarged to some degree in comparison to the dimension $d_4$ of FIG. 8. For example, the distance $d_8$ may be: approximately 0.6 μm or less; between 0.6 and 0.9 μm; or approximately 0.9 μm or greater.

The contacts on the source/drain regions may be placed at minimum spacing and directly aligned in a lateral direction of the source/drain regions. One way to reduce Coff is to offset the contacts in the source/drain, and therefore increase the distance between these contacts, thereby reducing the OFF capacitance. The number of contacts may also be reduced by increase their spacing. However, doing so may increase the On-resistance of the switch which may produce undesirable effects.

Certain embodiments disclosed herein provide for reduced OFF-state capacitance through the use/fabrication of contacts on neighboring drain/source regions that are offset, rather than aligned in the lateral direction. In certain embodiments, offsetting the source/drain contacts may not produce negative effects for relatively large-device-width applications.

Figure 10A:
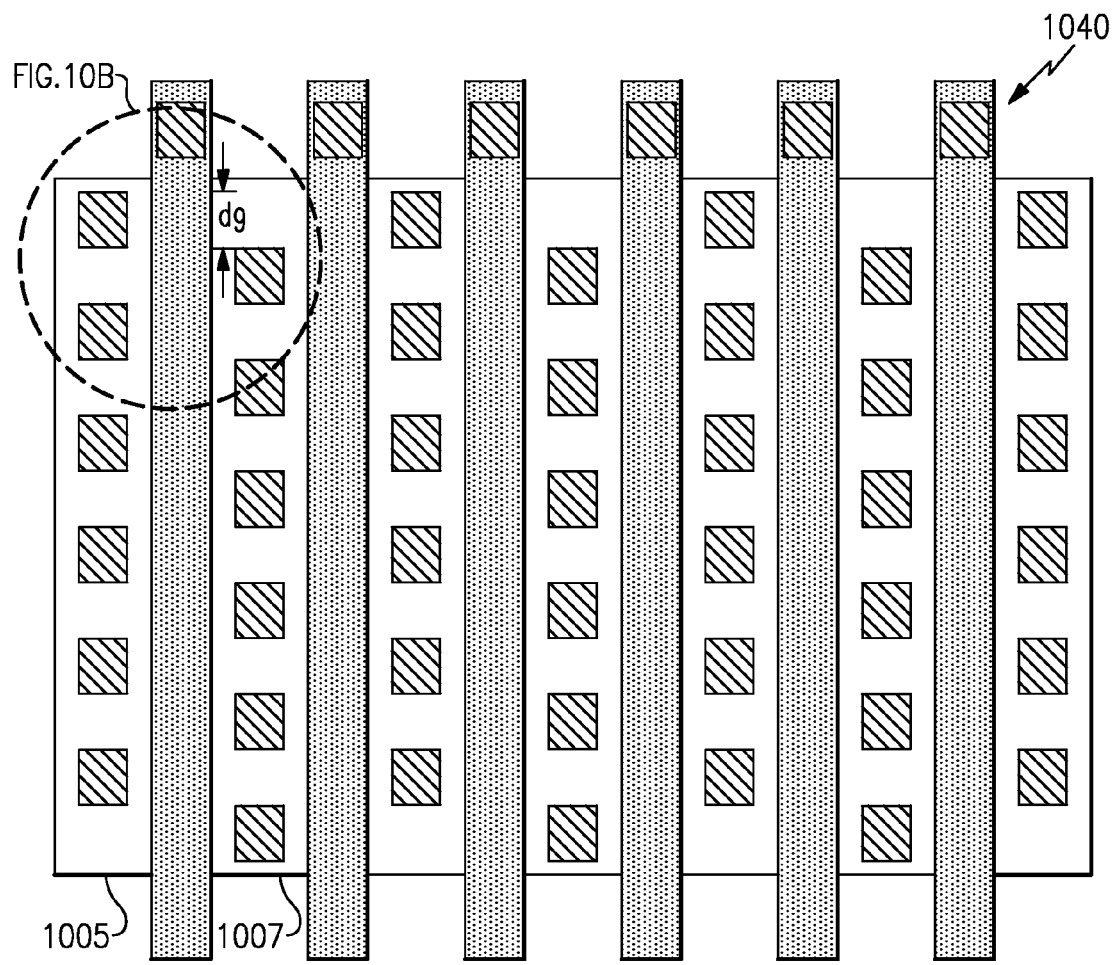
FIG. 10A illustrates an embodiment of a device having offset drain/source contacts according to one or more embodiments.
Figure 10B:
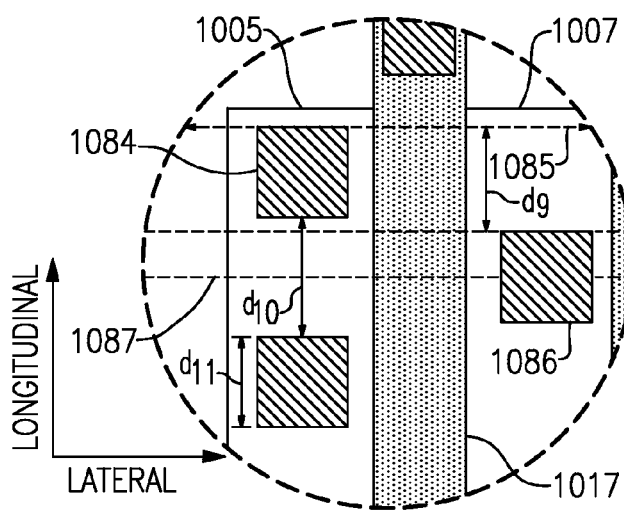
FIG. 10B provides a detailed view of a portion of the device of FIG. 10A according to one or more embodiments.

FIG. 10A illustrates an embodiment of a device 1040 having offset drain/source contacts. FIG. 10B provides a detailed view of a portion of the device 1040 of FIG. 10A. Rather than being substantially aligned in the lateral direction 1085, the contacts of neighboring drain/source regions (e.g., 1005, 1007) may be staggered, as shown. That is, neighboring drain/source regions (e.g., 1005, 1007) may include contacts that are offset, or shifted by a relative distance $d_9$ along longitudinal dimension of the gate channel(s) (e.g., 1017). In certain embodiments, the offset dimension is equal approximately to: $d_{11}+\frac{1}{2}(d_{10}-d_{11})$, wherein $d_{10}$ represents the contact size and $d_{11}$ represents the contact-to-contact spacing in the longitudinal dimension. Such a configuration may result in a lateral central axis 1087 of the contact 1086 being positioned such that it laterally bisects the distance $d_{10}$ between contacts in a neighboring drain/source region 1005. In certain embodiments, the offset dimension $d_9$ may be: approximately 0.20 µm or less; approximately 0.21 µm; approximately 0.22 µm; approximately 0.23 µm; approximately 0.24 µm; or greater than 0.24 µm.

In certain embodiments, the dimension $d_{11}$ may be: approximately 0.16 µm or less; between 0.16 and 0.20 µm; between 0.20 and 0.22 µm; or greater than 0.22 µm. Furthermore, the dimension $d_{10}$ may be: approximately 0.24 µm or less; between 0.24 and 0.26 µm; or approximately 0.26 µm or greater. In certain embodiments, the smaller the distance $d_{10}$, the greater the OFF-state capacitance of the device 1040.

Figure 11:
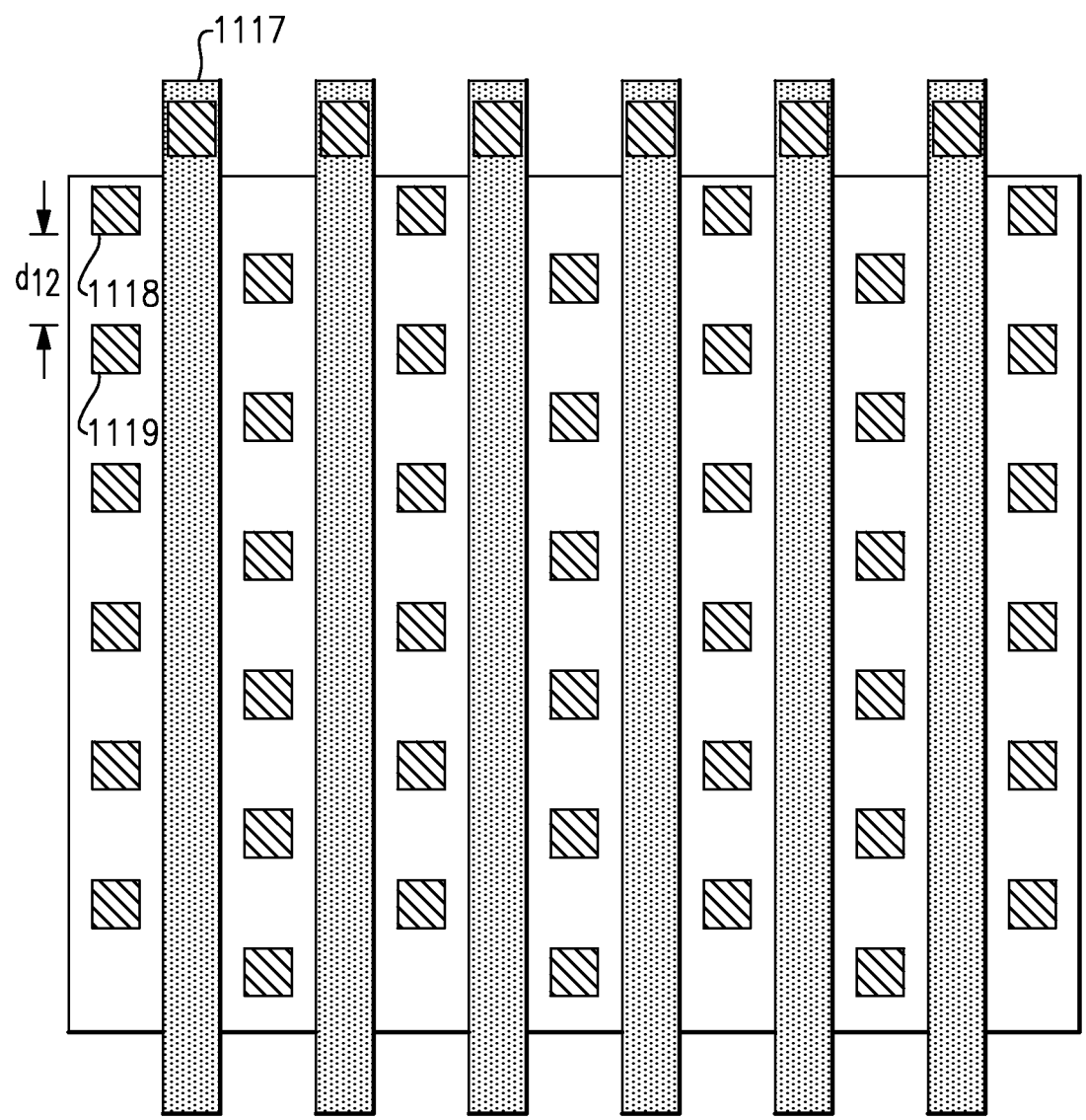
FIG. 11 illustrates an embodiment of a device comprising offset contacts according to one or more embodiments.

FIG. 11 illustrates an embodiment of a device comprising offset contacts having relatively greater contact-to-contact spacing. As shown, the dimension $d_{11}$ represents the distance along a longitudinal axis of the gate channel(s) 1117 separating adjacent contacts 1118, 1119. In certain embodiments, the distance $d_{10}$ may be: approximately 0.48 µm or less; between 0.48 and 0.52 µm; or approximately 0.52 µm or greater. In certain embodiments, the greater the distance $d_{10}$, the less the OFF-state capacitance of the device 1140. In view of the increased contact-to-contact spacing, the device 1140 may comprise a smaller overall number of contacts relative to a device having a smaller contact-to-contact distance while having a similar area or device footprint. Therefore, the offset-contact solution of FIG. 11 may provide reduced $C_{off}$ without requiring substantially greater area, or any additional area, compared to certain other devices. However, the increase in contact-to-contact spacing may increase the ON-state resistance ($R_{on}$) of the device 1140 in certain configurations.

Packaged Module Implementation

Figure 12A:
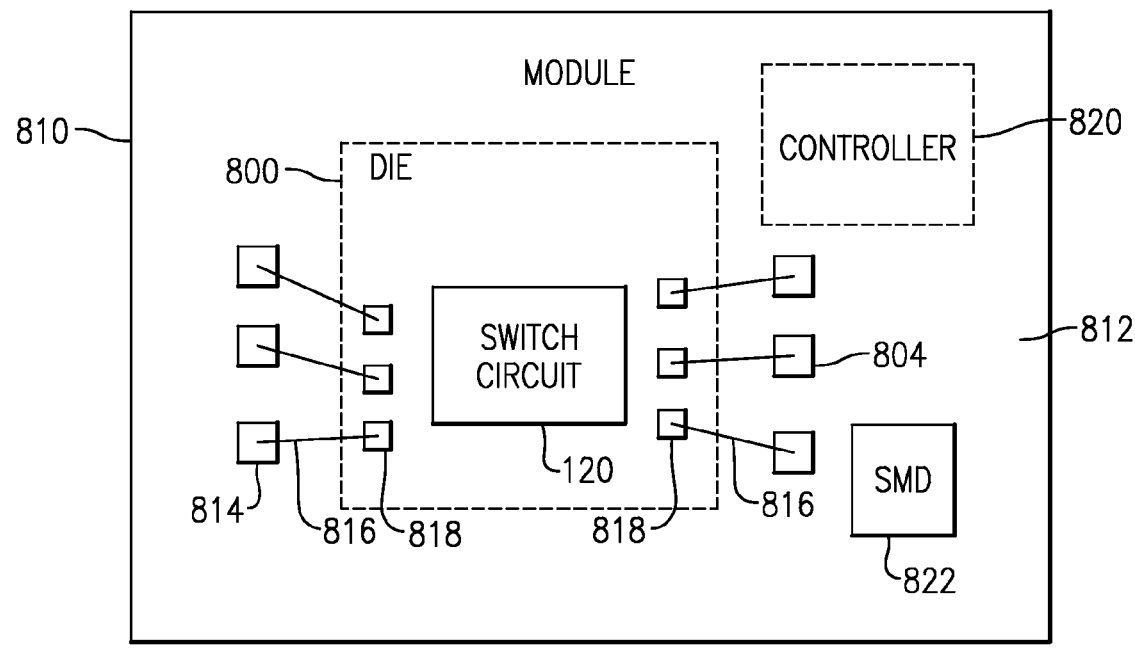
FIGS. 12A and 12B show plan and side views, respectively, of a packaged module having one or more features as described herein according to one or more embodiments.
Figure 12B:
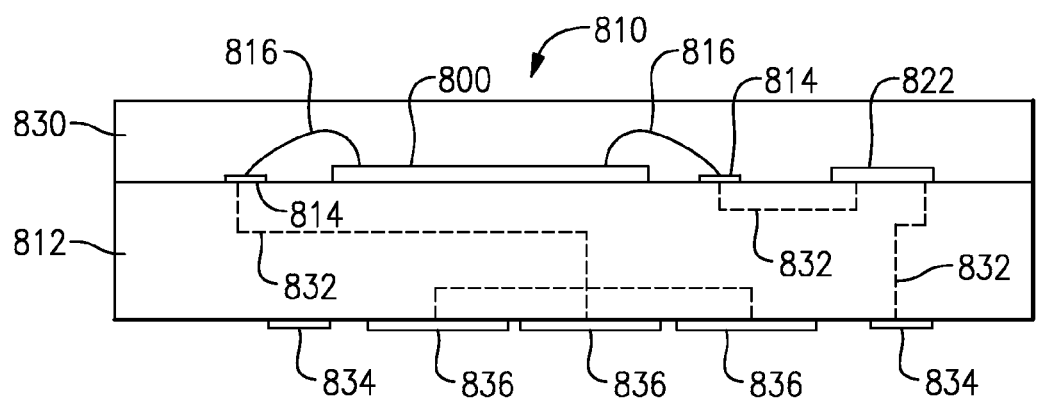

In some embodiments, one or more die having one or more features described herein can be implemented in a packaged module. An example of such a module is shown in FIGS. 12A (plan view) and 12B (side view). A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 and a bias/coupling circuit 150 is shown to be mounted on the packaging substrate 812. The die 800 can be electrically connected to other parts of the module (and with each other where more than one die is utilized) through connections, such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 13:
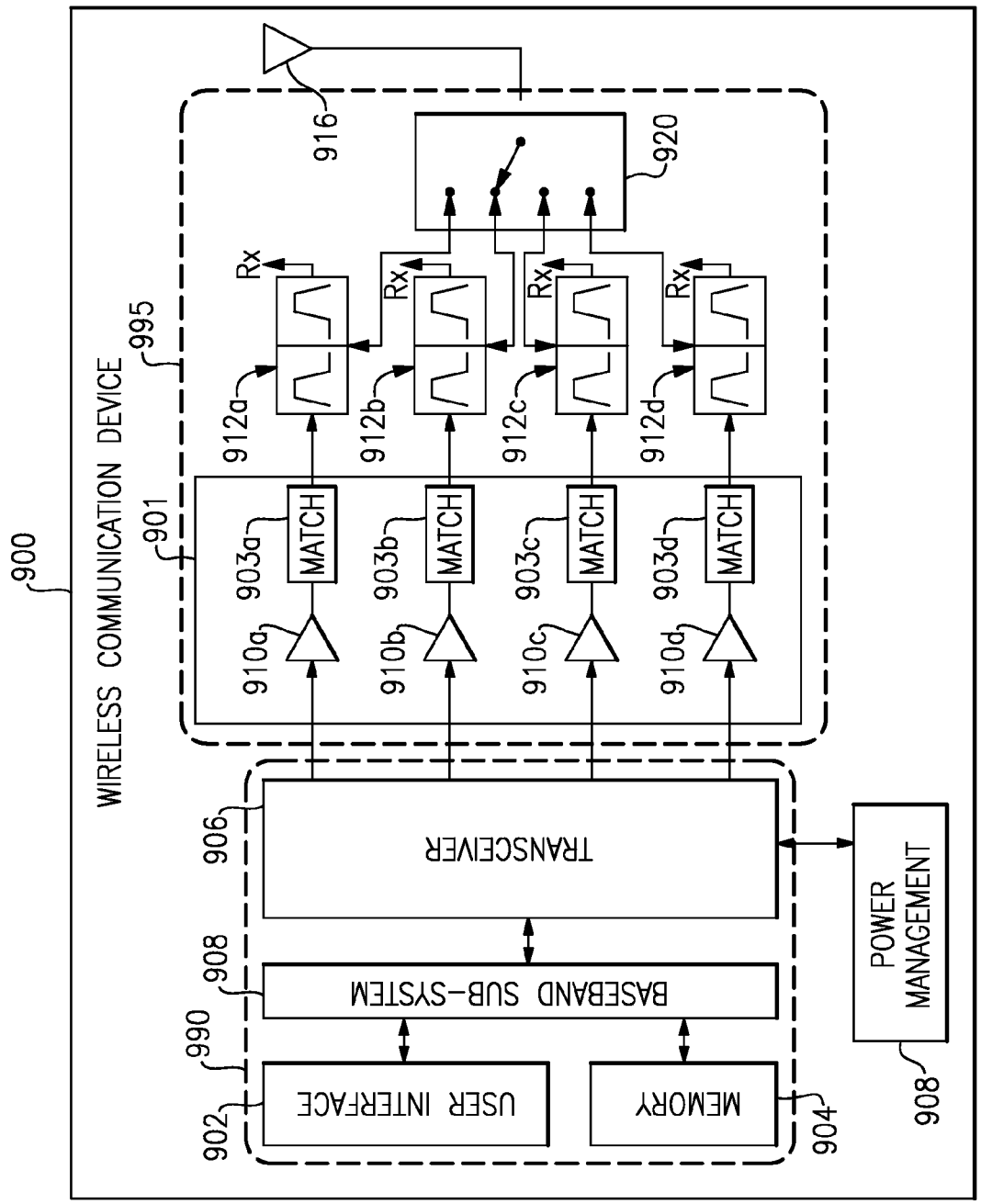
FIG. 13 depicts an example wireless device having one or more advantageous features described herein according to one or more embodiments.

FIG. 13 schematically depicts an example wireless communication device 900 having one or more advantageous features described herein. The wireless communication device 900 may include both RF components 995 and baseband components 990. In certain embodiments, the wireless communication device 900 may include one or more switch devices having offset drain/source contacts associated therewith according to one or more embodiments disclosed herein. In some embodiments, such a switching device configuration can provide reduced OFF-state capacitance.

In the example wireless device 900, a power amplifier (PA) module 901 having a plurality of PAs can provide an amplified RF signal to a switch 920, and the switch 920 can route the amplified RF signal to an antenna 916. The PA module 901 can receive an unamplified RF signal from a transceiver 906 that can be configured and operated in a known manner. The transceiver 906 can also be configured to process received signals. The transceiver 906 is shown to interact with a baseband sub-system 908 that is configured to provide conversion between data and/or voice signals suitable for a user and RF signals suitable for the transceiver 906. The transceiver 906 is also shown to be connected to a power management component 906 that is configured to manage power for the operation of the wireless device 900. Such a power management component can also control operations of various components of the wireless communication device 900.

The baseband sub-system 908 is shown to be connected to a user interface 902 to facilitate various input and output of voice and/or data provided to and received from the user. The baseband sub-system 908 can also be connected to a memory 904 that is configured to store data and/or instructions to facilitate the operation of the wireless device, and/or to provide storage of information for the user.

In some embodiments, a duplexer 912a-912d can allow transmit and receive operations to be performed simultaneously using a common antenna (e.g., 916). In FIG. 13, received signals are shown to be routed to "Rx" paths (not shown) that can include, for example, one or more low-noise amplifiers (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A semiconductor die comprising:
    a semiconductor substrate;
    first and second elongated doped regions, said first region serving as a source of a first transistor, said second region serving as a drain of the first transistor and a source of a second transistor;
    a plurality of straight elongated gate structures including a first gate structure disposed between the first and second regions and serving as a gate of the first transistor and a second gate structure disposed adjacent to the second region and serving as a gate of the second transistor, the second gate structure being parallel with the first gate structure;
    a first set of evenly-spaced electrical contact pads disposed on the first region, the first set of electrical contact pads including contact pads having a side dimension $d_1$; and
    a second set of evenly-spaced electrical contact pads disposed on the second region, the second set of contact pads including contact pads having the side dimension $d_1$, the second set of contact pads being offset with respect to the first set of contact pads in a longitudinal direction of the first and second regions.

2. The semiconductor die of claim 1 wherein the offset position of the second set of contact pads provides reduced OFF-state capacitance for a switch device of the semiconductor die compared to a non-offset position of the second set of contact pads.

3. The semiconductor die of claim 1 wherein the second set of contact pads are offset by a distance $d_2$.

4. The semiconductor die of claim 3 wherein the offset distance $d_2$ is a value such that a first contact ad of the second set of contact pads is disposed between, but not overlapping, first and second contact pads of the first set of contact pads in the longitudinal direction.

5. The semiconductor die of claim 3 wherein the first and second sets have pad-to-pad spacing of a distance $d_3$.

6. The semiconductor die of claim 5 wherein the first and second sets of contact pads are disposed within 0.7 μm of one another in a lateral direction.

7. The semiconductor die of claim 5 wherein the distance $d_3$ is at least two times the dimension $d_1$.

8. The semiconductor die of claim 5 wherein the distance $d_2$ is equal to: $d_1 + \frac{1}{2}(d_3 - d_1)$.

9. A method of fabricating a semiconductor die comprising:
    providing a semiconductor substrate;
    forming first and second elongated doped regions, said first region serving as a source of a first transistor, said second region serving as a drain of the first transistor and a source of a second transistor;
    forming a plurality of straight elongated gate structures including a first gate structure disposed between the first and second regions and serving as a gate of the first transistor and a second gate structure disposed adjacent to the second region and serving as a gate of the second transistor;
    disposing a first set of evenly-spaced electrical contact pads on the first region, the first set of electrical contact pads including contact pads having a side dimension $d_1$; and
    disposing a second set of evenly-spaced electrical contact pads on the second region, the second set of contact pads including contact pads having the side dimension $d_1$, the second set of contact pads being offset with respect to the first set of contact pads in a longitudinal direction of the first and second regions.

10. The method of claim 9 wherein the offset position of the second set of contact pads provides reduced OFF-state capacitance for a switch device of the semiconductor die compared to a non-offset position of the second set of contact pads.

11. The method of claim 9 wherein the second set of contact pads are offset by a distance $d_2$.

12. The method of claim 11 wherein the offset distance $d_2$ is a value such that a first contact pad of the second set of contact pads is disposed between, but not overlapping, first and second contact pads of the first set of contact pads in the longitudinal direction.

13. The method of claim 11 wherein the first and second sets have pad-to-pad spacing of a distance $d_3$.

14. The method of claim 13 wherein the first and second sets of contact pads are disposed within 0.7 μm of one another in a lateral direction.

15. The method of claim 13 wherein the distance $d_3$ is at least two times the dimension $d_1$.

16. The method of claim 13 wherein the distance $d_2$ is equal to: $d_1 + \frac{1}{2}(d_3 - d_1)$.

17. A radio-frequency (RF) module comprising:
a packaging substrate configured to receive a plurality of components;
a die mounted on the packaging substrate, the die having a semiconductor substrate, first and second elongated doped regions, said first region serving as a source of a first transistor, said second region serving as a drain of the first transistor and a source of a second transistor, a plurality of straight elongated gate structures including a first gate structure disposed between the first and second regions and serving as a gate of the first transistor and a second gate structure disposed adjacent to the second region and serving as a gate of the second transistor, a first set of evenly-spaced electrical contact pads disposed along a longitudinal direction on the first region, the first set of electrical contact pads including contact pads having a side dimension $d_1$, and a second set of evenly-spaced electrical contact pads disposed along the longitudinal direction on the second region, the second set of contact pads including contact pads having the side dimension $d_1$, the second set of contact pads being offset with respect to the first set of contact pads in the longitudinal direction; and
a plurality of connectors configured to provide electrical connections between the die and the packaging substrate.

18. The RF module of claim 17 wherein an offset distance $d_2$ of the second set of contact pads is a value such that a first contact pad of the second set of contact pads is disposed between, but not overlapping, first and second contact pads of the first set of contact pads in the longitudinal direction.

19. The RF module of claim 18 wherein the first and second sets have pad-to-pad spacing of a distance $d_3$.

20. The RF module of claim 17 wherein the first and second sets of contact pads are disposed within 0.7 μm of one another in a lateral direction.

* * * * *